United States Patent [19]

Oi et al.

[11] Patent Number: 4,812,551
[45] Date of Patent: Mar. 14, 1989

[54] NOVOLAK RESIN FOR POSITIVE PHOTORESIST

[75] Inventors: Fumio Oi, Ashiya; Haruyoshi Osaki, Toyonaka; Akihiro Furuta, Takatsuki; Yukikazu Uemura, Amagasaki; Takao Ninomiya, Ibaraki; Yasunori Uetani, Minoo; Makoto Hanabata, Hyogo, all of Japan

[73] Assignee: Sumitomo Chemical Company, Limited, Osaka, Japan

[21] Appl. No.: 118,041

[22] Filed: Nov. 9, 1987

[30] Foreign Application Priority Data

Nov. 8, 1986 [JP] Japan ............................ 61-266402
Sep. 2, 1987 [JP] Japan ............................ 62-220664

[51] Int. Cl.[4] .................................... C08G 8/04
[52] U.S. Cl. ............................. 528/129; 528/153; 528/155; 528/493; 430/165; 430/189; 430/192; 430/193; 430/270; 430/313; 430/319
[58] Field of Search ............... 528/129, 153, 155, 493; 430/319, 313, 165, 189, 270, 192, 193

[56] References Cited

U.S. PATENT DOCUMENTS 4,173,470 11/1979 Fahrgnholtz et al. ............. 528/155
4,719,167 1/1988 Miura et al. ........................ 528/153

Primary Examiner—Morton Foelak
Assistant Examiner—S. A. Acquah
Attorney, Agent, or Firm—Wenderoth, Lind & Ponack

[57] ABSTRACT

A novolak resin for a positive photoresist is provided herein, which resin is produced by the addition condensation reaction of a phenol with formaldehyde. This novolak resin has improved heat resistant and sensitivity properties and the thickness retention of the novolak resins are very high. The novolak resins are characterized in that the area ratio of the gel permeation chromatographic pattern (GPC) as measured by the use of a UV(254 nm) detector, is as follows: a range wherein the molecular weight, calculated as polystyrene, is from 150 to less than 500, not including a phenol and the unreacted monomer, is from 8 to 35%, hereinafter referred to as an A region, the range wherein the molecular weight calculated as polystyrene is from 500 to less than 5000 is from 0 to 30%, hereinafter referred to as a B region, and the range wherein the molecular weight calculated as polystyrene exceeds 5000 is from 35 to 92%, hereinafter referred to as the C region, and wherein the ratio of the B region to the A region is 2.50 or less.

5 Claims, 2 Drawing Sheets

NOVOLAK RESIN FOR POSITIVE PHOTORESIST

BACKGROUND OF THE INVENTION (1) Field of the Invention

The present invention relates to a positive photoresist composition excellent in sensitivity, heat resistance and dimensional reproducibility.

(2) Description of the Prior Art

A light-sensitive resin composition containing a compound having a quinone diazide group such as a naphthoquinone diazide or benzoquinone diazide group, upon irradiation with light of from 300 to 500 nm, produces a carboxyl group by the decomposition of the quinone diazide group, whereby the composition, which is alkali-insoluble in itself, turns alkali-soluble. This property is made use of to use the composition as a positive photoresist. In this case, a novolak resin is generally used in combination. This resin is important to obtain a uniform and strong resist film. This positive photoresist has a feature that the resolving power is markedly superior as compared with a negative photoresist. This high resolving power is made use of to use the positive photoresist as an etching protective film when a photographic etching method is applied to produce copper-clad printed circuit boards for printed circuit and integrated circuits such as IC and LSI.

Particularly, with the integrated circuits, miniaturization has proceeded with a rise in the integration level to result in a demand for the formation of patterns of an order of submicron. Hitherto, a mask contact printing method has been used for the formation of integrated circuits, but it is said that the limit of this method is 2 $\mu$m, and a reduction projection exposure method is attracting attention as a substitute therefor. This method is of a form of reducing and projecting the pattern of a master mask (reticle) by passing light through a lens system, and a resolving power of up to an order of submicron can be obtained. However, one of the problems of this method is a low through-put. That is, unlike the 1:1 contact or projection exposure methods such as the conventional mask contact printing method, this reduction projection exposure method, because of a need of divided and repeated light exposure, has a problem that the total of exposure times per a piece of wafer is long.

For solving this problem, raising the sensitivity of the resist used is most important, not to speak of improvement in the apparatus. If the exposure time can be shortened by raising the sensitivity, a rise in the through-put and as a result, a rise in the yield can be attained.

When the positive photoresist now in practical use is viewed from this standpoint, it may not always be said that the photoresist is satisfactory in terms of the sensitivity. Generally, the positive photoresist is lower in the sensitivity than the negative photoresist, an improvement in the sensitivity being desired.

The simplest method to raise the sensitivity is to reduce the molecular weight of a novolak resin used in the positive photoresist, and this method accelerates the dissolution of the photoresist in an alkaline developing solution to apparently raise the sensitivity of the photoresist.

This method, however, causes a very serious disadvantage that the heat resistance of the photoresist lowers, in addition to problems such as: Film thickness loss in the unexposed area becomes large (lowering in the so-called film thickness retention), the shape of the pattern changes for the worse, and the so-called $\gamma$ value lowers because a difference in the rates at which the exposed area and unexposed area dissolve in the developing solution becomes small.

The term "heat resistance of the positive photoresist" referred to herein means the resistance to heat of the resist pattern after development. More specifically, when heat is applied from the outside to the resist pattern formed on a substrate, the resist pattern softens and flows, or changes in the shape at a temperature higher than a certain one, and what degree of ambient atmospheric temperature the resist pattern can stand to retain its original sharp shape without deformation is the measure of the heat resistance of the photoresist. When the resist pattern softens and flows, or changes in shape, the dimension of the etched substrate after etching goes wrong, or the dimension fluctuates, so that the resist cannot perform a role required for it as an etching protective film. That is, the yield sharply lowers, which is not preferred.

In relation to these techniques, Japanese Patent Publication Kokai (Laid-open) No. 189739/1985 discloses that a photoresist composition superior in the heat resistance is obtained when the content of 1-3 nucleus of a novolak resin is made less than 10% by weight.

On the other hand, three great characteristics required for the resist are sensitivity, resolution and heat resistance.

If the resist lacks any one of these characteristics, it cannot be used as resist, so that all the three characteristics need to be excellent. Among these three, sensitivity and heat resistance tend to conflict with each other in a certain aspect, and resists satisfying these two at the same time have not been on the market up to now.

In view of the present situation like this, the present inventors extensively studied to develop a positive photoresist having any one of the sensitivity and heat resistance improved without impairing the other one as well as having excellent resolution, and as a result, found that a positive photoresist composition having excellent heat resistance can be obtained with a high sensitivity being maintained by adjusting the shape of the gel permeation chromatographic pattern (GPC pattern) of a novolak resin to the predetermined one. The present inventors thus completed the present invention.

SUMMARY OF THE INVENTION

The present invention provides a novolak resin for use in a positive photoresist which is produced by addition condensation reaction of a phenol with formaldehyde and characterized in that the area ratio of the gel permeation chromatographic pattern (GPC pattern) [measured by the use of a UV(254 nm) detector] is as follows: A range wherein the molecular weight calculated as polystyrene is from 150 to less than 500 (not including a phenol and the unreacted monomer) is from 8 to 35% (hereinafter referred to as A region), a range wherein the molecular weight calculated as polystyrene is from 500 to less than 5000 is from 0 to 30% (hereinafter referred to as B region) and a range wherein the molecular weight calculated as polystyrene exceeds 5000 is from 35 to 92% (hereinafter referred to as C region), and besides that the ratio of the B region to the A region is 2.50 or less.

The term "the molecular weight of a novolak resin" referred to herein means a value obtained by gel permeation chromatography (hereinafter referred to as GPC)

with monodispersed polystyrene as a standard. The GPC chromatogram was measured by connecting HLC-802A chromatograph (produced by Toyo Soda K.K.) with one piece each of G-4000H$_8$ column and G-2000H$_8$ column (both are produced by Toyo Soda K.K.) in series, and streaming tetrahydrofuran, a carrier solvent, at a flow rate of 1 ml/min. Chromatography was carried out using a UV(254 nm) detector. The molecular weight was obtained from a calibration curve prepared with monodispersed polystyrene. That is, the calibration curve was prepared by third order regression using monodispersed polystyrenes of which the weight average molecular weight is 300,000, 100,000, 35,000, 4,000 and 800, respectively and a styrene monomer (molecular weight, 104).

Next, reference will be made to the relationship between the GPC pattern of a novolak resin characterized by the present invention and the sensitivity and heat resistance of the resin as a resist.

Figure 4:
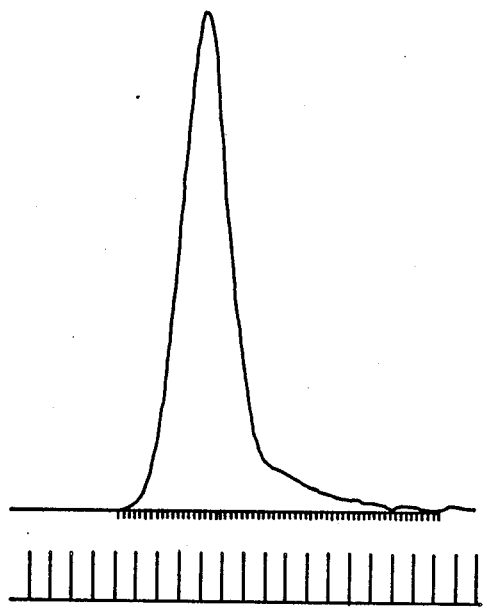

The novolak resin having a GPC pattern as shown in FIG. 4 was originally prepared by fractionation, etc., and this resin is one wherein the area ratios of the A and B regions have been made small. Resists with this resin have an improved heat resistance, but sharply lower in the sensitivity.

Figure 1:
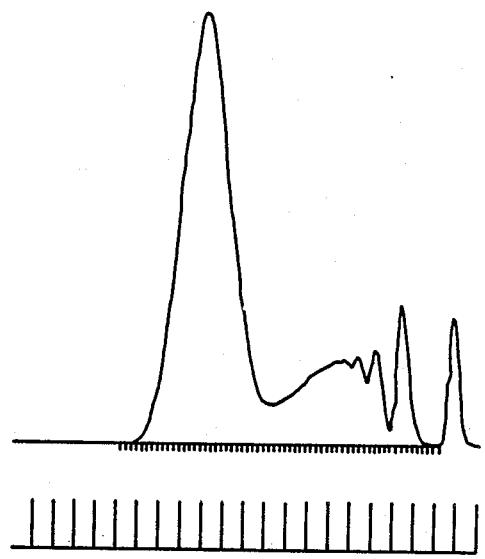
FIG. 1 is a representative GPC pattern of the particular novolak resin defined by the present invention, and the novolak resin showing such a GPC pattern not only satisfies both of the sensitivity and heat resistance at the same time, but also sharply improves the dimensional reproducibility of mask patterns which is a guide to the resolution.
Figure 2:
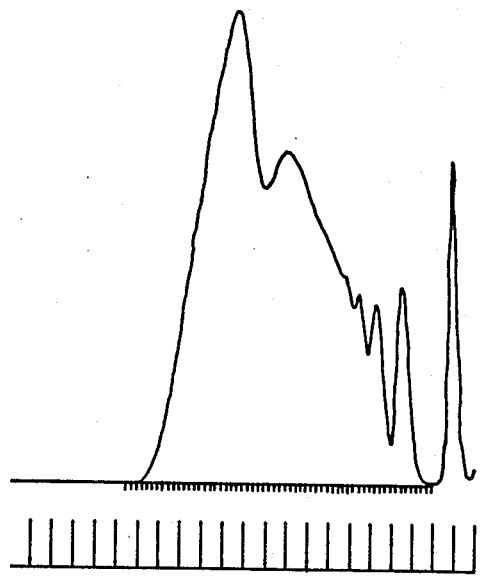
FIG. 2 is a representative GPC pattern of the conventionally known novolak resins, and the sensitivity and heat resistance of resists with the novolak resins having such a pattern tend to conflict with each other, which is not preferred.
Figure 3:
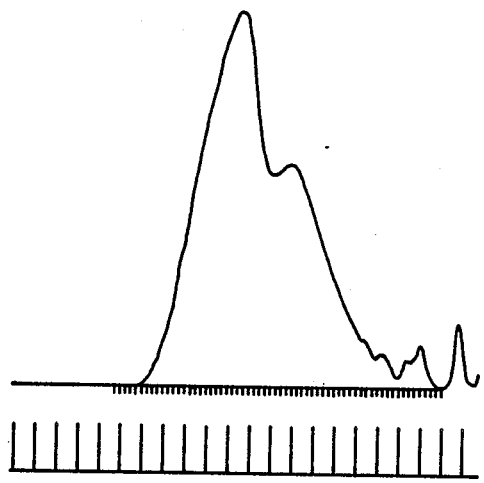
FIG. 3 represents the GPC pattern of novolak resins similar to that described in the foregoing Japanese Patent Publication Kokai (Laid-open) No. 189739/1985, and a resist with such resins is improved to some degree in balance between the sensitivity and heat resistance, but the balance may not yet be said to be satisfactory.

As is apparent from every figure, the GPC pattern in FIG. 1 is characterized in that the area ratio of B region is small as compared with those of A and C regions.

Next, the present invention will be illustrated in more detail.

DETAILED DESCRIPTION OF THE INVENTION

Specific examples of a phenol used as a material for the novolak resin used in the present invention include phenol, cresol, xylenol, ethylphenol, trimethylphenol, propylphenol, butylphenol, dihydroxybenzene, naphthols, etc. These phenols may be used alone or in combination.

To use a cresol as a phenol is particularly preferred. As a cresol, ortho-, meta- or para-cresol may be used alone or in combination.

Specifically, to use meta-cresol alone or a meta-cresol/para-cresol mixture is preferred. In the latter case, a meta-cresol/para-cresol ratio is preferably 100/0 to 20/80.

Particularly, in order to attain the object of the present invention more effectively, it is most preferred that the ratio of meta-cresol and para-cresol contained in the novolak resin corresponding to the A region described above is from 10/0 to 2/8, and that of meta-cresol and para-cresol contained in the novolak resin corresponding to the C region is from 10/0 to 4/6.

In the present invention, for formaldehyde used in the addition condensation reaction with a phenol, aqueous formaldehyde solution (formalin) and paraformaldehyde, which is the oligomer of formaldehyde, are used. Particularly, 37% formalin is advantageously mass-produced in industry.

In the present invention, the addition condensation reaction of a phenol with formaldehyde is carried out according to the usual method. This reaction is carried out at a temperature of from 60° to 120° C. for from 2 to 30 hours. Organic acids, inorganic acids or divalent metal salts are used as a catalyst. Specifically, ther are given oxalic acid, hydrochloric acid, sulfuric acid, perchloric acid, p-toluenesulfonic acid, trichloroacetic acid, phosphoric acid, formic acid, zinc acetate, magnesium acetate, etc.

The reaction may be carried out in bulk or with a suitable solvent.

The area ratio of the GPC pattern [measured by the use of a UV(254 nm) detector] of the novolak resin obtained by the usual method is, for example, from 5 to 20% for the A region, from 32 to 45% for the B region and from 46 to 60% for the C region. By adjusting the area ratio of this GPC pattern to from 8 to 35% for the A region, from 0 to 30% for the B region and from 35 to 92% for the C region and besides adjusting the B region/A region ratio to 2.50 or less, the particular novolak resin for resist defined by the present invention can be obtained.

For regulating the GPC pattern of the novolak resin as described above, a method of fractionating the novolak resin and blending the fractions obtained is preferably given.

For the fractionation method, there are a method of dissolving the synthesized novolak resin in a good solvent described below and precipitating the resin by adding water, and a method of adding the resin to a poor solvent (e.g. heptane, hexane, pentane, cyclohexane) and separating the resin by liquid separation. The good solvent includes for example alcohols (e.g. methanol, ethanol, propanol), ketones (e.g. acetone, methyl ethyl ketone, methyl isobutyl ketone), ethylene glycol or its ethers and ether esters (e.g. ethyl cellosolve, ethyl cellosolve acetate), propylene glycol or its ethers and ether esters (e.g. propylene glycol monomethyl ether acetate), acetic acid esters (e.g. methyl acetate, ethyl acetate), formamide, dimethylformamide, tetrahydrofuran, dioxane, dimethyl sulfoxide, acetonitrile, etc.

An alternative method to regulate the GPC pattern of this novolak resin is one wherein novolak resins consisting mainly of the A, B and C regions, respectively, are separately synthesized, and the fractions obtained by fractionation of these resins are combined with one another. By this method, the novolak resin having a preferred GPC pattern can also be obtained.

The novolak resin thus regulated has a weight average molecular weight, as calculated as polystyrene, of from 3000 to 35000, preferably from 5000 to 30000, more preferably from 7000 to 26000.

Next, referring to the positive photoresist composition with the novolak resin of the present invention, a quinone diazide compound is used as a light sensitive component. This quinone diazide compound is obtained by the well-known method, for example, by condensing naphthoquinonediazidesulfonyl chloride or benzoquinonediazidesulfonyl chloride with a compound having a hydroxyl group in the presence of a weak alkali. Examples of the compound having a hydroxyl group include hydroquinone, resorcinol, phloroglucinol, 2,4-dihydroxybenzophenone, 2,3,4-trihydroxybenzophenone, 2,3,4,4'-tetrahydroxybenzophenone, 2,2',4,4'-tetrahydroxybenzophenone, 2,3,4,3'-tetrahydroxybenzophenone, 2,3,4,2',3'-pentahydroxybenzophenone, 2,3,4,2',4'-pentahydroxybenzophenone, 2,3,4,2',5'pentahydroxybenzophenone, 2,3,4,3',4'-pentahydroxybenzophenone, 2,3,4,3',5'-pentahydroxybenzophenone, 2,3,4,3',4',5'-hexahydroxybenzophenone, gallic acid alkyl esters, etc.

Preparation of the positive photoresist is carried out by mixing and dissolving the foregoing quinone diazide compound and the novolak resin of the present invention in a solvent. The ratio of the novolak resin and the quinone diazide compound is preferably in a range of from 1:1 to 6:1. A preferred solvent used is such that it evaporates at a suitable drying rate to give a uniform and smooth coating film. Such a solvent includes ethyl cellosolve acetate, methyl cellosolve acetate, ethyl cellosolve, methyl cellosolve, propylene glycol monomethyl ether acetate, butyl acetate, methyl isobutyl ketone, xylene, etc. To the positive photoresist composition obtained by the foregoing method, small amounts of resins, dyes, etc. may be added as additive as need arises.

The positive photoresist composition prepared by combining the novolak resin of the present invention and the quinone diazide compound, for example, as a light sensitive component has excellent sensitivity and remarkably improved heat resistance and dimensional reproducibility.

The present invention will be illustrated more specifically with reference to the following examples, but it is not limited to these examples.

REFERENCE EXAMPLES 1 to 4

To a 1000-ml three-necked flask were added 270 g of m-cresol, 2.7 g of zinc acetate dihydrate and 27 g of ion-exchanged water, and 182 g of an aqueous formalin solution (37.0%) was added dropwise over 40 minutes while heating and stirring on an oil bath of 90° C. Thereafter, reaction was carried out with heating and stirring for further 3 hours. Thereafter, 250 g of ethyl cellosolve acetate was added, and then 40 g of a 5% aqueous oxalic acid solution was added dropwise over 40 minutes. Reaction was carried out with heating and stirring for a pre-determined period of time, and the reaction solution was neutralized, washed with water and dehydrated to obtain an ethyl cellosolve acetate solution of novolak resin. The weight average molecular weight and the area ratio of the GPC pattern measured by GPC chromatography were as follows:

| Reference example | Reaction time | Weight average molecular weight | Area ratio of GPC pattern | | |
|---|---|---|---|---|---|
| | | | A region | B region | C region |
| 1 | 15 | 11800 | 12.1 | 39.9 | 48.0 |
| 2 | 7 | 7250 | 14.0 | 41.0 | 45.0 |
| 3 | 19 | 16000 | 11.7 | 36.5 | 51.8 |
| 4 | 28 | 20760 | 8.7 | 34.3 | 57.0 |

REFERENCE EXAMPLES 5 and 6

To a 1000-ml three-necked flask were added 189 g of m-cresol, 81 g of p-cresol, 2.7 g of zinc acetate dihydrate and 27 g of ion-exchanged water, and 182 g of an aqueous formalin solution (37.0%) was added dropwise over 40 minutes while heating and stirring on an oil bath of 90° C. Thereafter, reaction was carried out with heating and stirring for further 6 hours. Thereafter, 250 g of ethyl cellosolve acetate was added, and then 40 g of a 5% aqueous oxalic acid solution was added dropwise over 40 minutes. Reaction was carried out with heating and stirring for 10 hours, and the reaction solution was neutralized, washed with water and dehydrated to obtain an ethyl cellosolve acetate solution of novolak resin. The weight average molecular weight and the area ratio of the GPC pattern measured by GPC chromatography were as follows:

| Reference example | Weight average molecular weight | Area ratio of GPC pattern | | |
|---|---|---|---|---|
| | | A region | B region | C region |
| 5 | 9600 | 10.1 | 41.5 | 48.4 |
| 6 | 6500 | 11.3 | 40.7 | 48.0 |

EXAMPLE 1

First fractionation:

308 Grams of the ethyl cellosolve acetate solution of novolak resin obtained in Reference example 1 (content of the novolak resin, 46.4%) was added to a 5-liter separable flask, and 646 g of ethyl cellosolve acetate and 1892 g of n-heptane were additionally added. After stirring for 30 minutes at 20° C., the resulting mixture was allowed to stand still and separated.

Second fractionation:

To a 5-liter separable flask was added 424 g of the lower-layer mass, and 2134 g of ethyl cellosolve acetate and 1042 g of n-heptane were added additionally, and the same procedure as in the first fractionation was repeated. To the lower-layer mass obtained by liquid separation was added the upper-layer mass obtained by the first fractionation, and heptane was removed by means of an evaporater to obtain an ethyl cellosolve acetate solution of novolak resin. The weight average molecular weight and the area ratio of the GPC pattern measured by GPC chromatography were as follows:

| Example | Weight average molecular weight | Area ratio of GPC pattern | | |
|---|---|---|---|---|
| | | A region | B region | C region |
| 1 | 22960 | 15.5 | 12.1 | 72.4 |

EXAMPLES 2 to 4

Ethyl cellosolve acetate solutions of novolak resin were obtained by completely the same procedure as in Example 1 except that the amounts of the ethyl cellosolve acetate solution of novolak resin, which is a material before fractionation, ethyl cellosolve acetate and n-heptane were changed. The amounts of the material before fractionation, ethyl cellosolve acetate and n-heptane are as follows:

| Example | Amount of the material before fractionation | First fractionation | | Second fractionation | |
|---|---|---|---|---|---|
| | | Ethyl cellosolve acetate | n-Heptane | Ethyl cellosolve acetate | n-Heptane |
| 2 | Resin of Reference example 2, 138 g | 54 g | 78 g | 388 g | 261 g |
| 3 | Resin of Reference example 3, 703 g | 270 g | 395 g | 4461 g | 2075 g |
| 4 | Resin of Reference example 6, 310 g | 650 g | 1900 g | 2200 g | 1100 g |

The weight average molecular weight and the area ratio of the GPC pattern, as measured by GPC chromatography, of the novolak resin obtained by fractionation were as follows:

| Example | Weight average molecular weight | Area ratio of GPC pattern | | |
|---|---|---|---|---|
| | | A region | B region | C region |
| 2 | 10050 | 15.8 | 24.5 | 59.7 |
| 3 | 25740 | 18.7 | 20.9 | 60.4 |
| 4 | 9290 | 26.3 | 22.7 | 51.0 |

EXAMPLE 5

To a 1000-ml three-necked flask were added 270 g of m-cresol and 50 g of 5% oxalic acid, and 120 g of an aqueous formalin solution (37.0%) was added dropwise over 40 minutes while heating and stirring on an oil bath of 90° C. Reaction was then carried out with heating and stirring for further 3 hours. Thereafter, the reaction solution was neutralized, washed with water and dehydrated to obtain an ethyl cellosolve acetate solution of novolak resin (Resin-1). The weight average molecular weight of the Resin-I was 710.

481 Grams of the ethyl cellosolve acetate solution of novolak resin obtained in Reference Example 1 (content of the novolak resin, 46.4%) was added to a 10-liter separable flask, and 3927 g of ethyl cellosolve acetate and 1795 g of n-heptane were additionally added. After stirring for 30 minutes at 20° C., the resulting mixture was allowed to stand still and separated. To the lower-layer mass obtained by liquid separation was added the foregoing Resin-I so that the content of the Resin-I was 20.0% by weight [calculated as novolak resin;

$$\frac{\text{Resin-I}}{\text{(lower-layer resin separated + Resin-I)}} \times 100].$$

Thereafter, n-heptane was removed by an evaporator to obtain an ethyl cellosolve acetate solution of novolak resin. The weight average molecular weight and the area ratio of the GPC pattern, measured by GPC chromatography, were as follows:

| Example | Weight average molecular weight | Area ratio of GPC pattern | | |
|---|---|---|---|---|
| | | A region | B region | C region |
| 5 | 21770 | 14.3 | 18.6 | 67.1 |

REFERENCE EXAMPLES 7 and 8

Ethyl cellosolve acetate solutions of novolak resin were obtained by completely the same procedure as in Example 1 except that the resin of Reference Example 2 was used as a material before fractionation, and that the amounts of ethyl cellosolve acetate and n-heptane were changed. The weight average molecular weight, calculated as polystyrene, of the novolak resin obtained by fractionation and the area ratio of the GPC pattern of the same resin measured by GPC chromatography were as follows:

| Reference example | Weight average molecular weight | Area ratio of GPC pattern | | |
|---|---|---|---|---|
| | | A region | B region | C region |
| 7 | 9500 | 2.0% | 38.5% | 59.5% |
| 8 | 26200 | 2.9% | 3.9% | 93.2% |

EXAMPLE 6

To a 3000-ml three-necked flask were added 625 g of a m-/p-cresol mixture (content of m-cresol, 61.5%), 185 g of p-cresol, 91 g of 5% aqueous oxalic acid and 756 g of ethyl cellosolve acetate, and 444 g of an aqueous formalin solution (37%) was added dropwise over 40 minutes while heating and stirring on an oil bath of 80° C. Reaction was then carried out with heating and stirring for further 6 hours. Thereafter, the reaction solution was neutralized, washed with water and dehydrated to obtain an ethyl cellosolve acetate solution of novolak resin.

An ethyl cellosolve acetate solution of novolak resin was obtained by completely the same procedure as in Example 1 except that the novolak resin obtained above was used, and that the amounts of ethyl cellosolve acetate and n-heptane were changed. The weight average molecular weight, calculated as polystyrene, of the novolak resin obtained by fractionation and the area ratio of the GPC pattern of the same resin measured by GPC chromatography were as follows:

| Example | Weight average molecular weight | Area ratio of GPC pattern % | | |
|---|---|---|---|---|
| | | A region | B region | C region |
| 6 | 7600 | 22.7 | 21.5 | 55.8 |

EXAMPLE 7

To a 1000-ml three-necked flask were added 270 g of m-cresol and 50 g of 5% aqueous oxalic acid, and 57 g of an aqueous formalin solution (37%) was added dropwise over 40 minutes while heating and stirring on an oil bath of 90° C. Reaction was then carried out with heating and stirring for further 2 hours. Thereafter, the reaction solution was neutralized, diluted with ethyl cellosolve acetate, washed with water and dehydrated to obtain an ethyl cellosolve acetate solution of novolak resin (Resin-II). The weight average molecular weight of the Resin-II was 330.

On the other hand, to a 3000-ml three-necked flask were added 724 g of a m-/p-cresol mixture (content of m-cresol, 61.5%), 86 g of p-cresol, 91 g of 5% aqueous oxalic acid and 756 g of ethyl cellosolve acetate, and 444 g of an aqueous formalin solution (37%) was added dropwise over 40 minutes while heating and stirring on an oil bath of 80° C. Reaction was then carried out with heating and stirring for further 8 hours. Thereafter, the reaction solution was neutralized ashed with water and dehydrated to obtain an ethyl cellosolve acetate solution of novolak resin.

Completely the same procedure as in Example 5 was carried out except that the novolak resin obtained above was used, and that the amounts of ethyl cellosolve acetate and n-heptane were changed. To the lower-layer mass thus obtained was added the foregoing Resin-II so that the content of the Resin-II was 25.0% by weight [calculated as novolak resin;

$$\frac{\text{Resin-II}}{\text{(lower-layer resin separated + Resin-II)}} \times 100].$$

Thereafter, n-heptane was removed by an evaporator to obtain an ethyl cellosolve acetate solution of novolak resin. The weight average molecular weight and the area ratio of the GPC pattern, as measured by GPC chromatography, were as follows:

| Example | Weight average molecular weight | Area ratio of GPC pattern % | | |
|---|---|---|---|---|
| | | A region | B region | C region |
| 7 | 11300 | 23.5 | 16.4 | 60.1 |

EXAMPLE 8

To a 1000-ml three-necked flask were added 270 g of m-cresol, 2.7 g of zinc acetate dihydrate and 27 g of ion-exchange water, and 121 g of an aqueous formalin solution (37.0%) was added dropwise over 40 minutes while heating and stirring on an oil bath of 80° C. Reaction was then carried out with heating and stirring for further 3 hours. Thereafter, 30 g of a 5% aqueous oxalic acid solution was added, and reaction was carried out with heating and stirring for a pre-determined period of time. The reaction solution was then neutralized, diluted with ethyl cellosolve acetate, washed with water and dehydrated to obtain an ethyl cellosolve acetate solution of novolak resin (Resin-III). The weight average molecular weight of this resin was 710.

On the other hand, to a 3000-ml three-necked flask were added 658 g of a m-/p-cresol mixture (content of m-cresol, 61.5%), 152 g of p-cresol and 91 g of 5% aqueous oxalic acid, and 426 g of an aqueous formalin solution (37%) was added dropwise over 40 minutes while heating and stirring on an oil bath of 80° C. Thereafter, reaction was carried out with heating and stirring for further 3 hours. The reaction solution was then neutralized, diluted with ethyl cellosolve acetate, washed with water and dehydrated to obtain an ethyl cellosolve acetate solution of novolak resin.

Completely the same procedure as in Example 5 was carried out except that the novolak resin obtained above was used, and that the amounts of ethyl cellosolve acetate and n-heptane were changed. To the lower-layer mass thus obtained was added the foregoing Resin-III so that the content of the Resin-III was 32.0% by weight [calculated as novolak resin;

$$\frac{\text{Resin-III}}{\text{(lower-layer resin separated + Resin-III)}} \times 100].$$

Thereafter, n-heptane was removed by an evaporator to obtain an ethyl cellosolve acetate solution of novolak resin.

The weight average molecular weight, calculated as polystyrene, of the novolak resin thus obtained and the area ratio of the GPC pattern of the same resin measured by GPC chromatography were as follows:

| Example | Weight average molecular weight | Area ratio of GPC pattern % | | |
|---|---|---|---|---|
| | | A region | B region | C region |
| 8 | 9200 | 16.6 | 25.0 | 58.4 |

EXAMPLE 9

To a 1000-ml three-necked flask were added 189 g of m-cresol, 113 g of p-tert-butylphenol and 30 g of 5% aqueous oxalic acid and 152 g of an aqueous formalin solution (37%) was added dropwise over 40 minutes while heating and stirring on an oil bath of 80° C. Reaction was then carried out with heating and stirring for further 6 hours. Thereafter, the reaction solution was neutralized, diluted with ethyl cellosolve acetate, washed with water and dehydrated to obtain an ethyl cellosolve acetate solution of novolak resin.

Completely the same procedure as in Example 5 was carried out except that the novolak resin obtained above was used, and that the amounts of ethyl cellosolve acetate and n-heptane were changed. To the lower-layer mass thus obtained was added the foregoing Resin-II of Example 7 so that the content of the Resin-II was 25.0% by weight [calculated as novolak resin;

$$\frac{\text{Resin-II}}{\text{(lower-layer resin separated + Resin-II)}} \times 100].$$

Thereafter, n-heptane was removed by an evaporator to obtain an ethyl cellosolve acetate solution of novolak resin. The weight average molecular weight, calculated as polystyrene, of the novolak resin thus obtained and the area ratio of the GPC pattern of the same resin measured by GPC chromatography were as follows:

| Example | Weight average molecular weight | Area ratio of GPC pattern % | | |
|---|---|---|---|---|
| | | A region | B region | C region |
| 9 | 13000 | 23.7 | 13.5 | 62.8 |

EXAMPLE 10

To a 1000-ml three-necked flask were added 154 g of a m-/p-cresol mixture (content of m-cresol, 61.5%), 36 g of p-cresol, 82 g of o-cresol and 30 g of 5% aqueous oxalic acid, and 170 g of an aqueous formalin solution (37%) was added dropwise over 40 minutes while heating and stirring on an oil bath of 80° C. Reaction was then carried out with heating and stirring for further 9 hours. Thereafter, the reaction solution was neutralized, diluted with ethyl cellosolve acetate, washed with water and dehydrated to obtain an ethyl cellosolve acetate solution of novolak resin.

Completely the same procedure as in Example 5 was carried out except that the novolak resin obtained above was used, and that the amounts of ethyl cellosolve acetate and n-heptane were changed. To the lower-layer mass thus obtained was added the foregoinig Resin-II of Example 7 so that the content of the Resin-II was 25.0% by weight $$\frac{\text{Resin-II}}{\text{(lower-layer resin separated + Resin-II)}} \times 100].$$

Thereafter, n-heptane was removed by an evaporater to obtain an ethyl cellosolve acetate solution of novolak resin.

The weight average molecular weight, calculated as polystyrene, of the novolak resin thus obtained and the area ratio of the GPC pattern of the same resin measured by GPC chromatography were as follows:

| Example | Weight average molecular weight | Area ratio of GPC pattern % | | |
|---|---|---|---|---|
| | | A region | B region | C region |
| 10 | 13200 | 22.8 | 13.0 | 64.2 |

APPLICATION EXAMPLES AND COMPARATIVE EXAMPLES

The novolak resins obtained in Examples and Reference examples were each dissolved together with a sensitizer in an ethyl cellosolve acetate/n-butyl acetate (8:2) solvent in a composition shown in Table 1, to prepare a resist solution. Hereupon, the amount of the solvent was regulated so that the film thickness was 1.28 $\mu$m when the resist solution was applied under a coating condition shown below.

Every composition was filtered through a Teflon filter of 0.2 $\mu$m in thickness to prepare a resist solution. The solution was then coated onto a silicon wafer, rinsed as usual, at a rate of 4000 rpm by means of a spinner. The silicon wafer was baked for 1 minute on a vacuum adsorption-type hot plate kept at 100° C., and exposed to light with the exposure time being stepwise varied at every shot by means of a reduction projection exposure apparatus with a 350 W super-high pressure mercury vapor lamp as a light sourse. Thereafter, the silicon wafer was developed using a developing solution SOPD (product of Sumitomo Chemical Company, Limited). After rinsing and drying, the amount of film thickness loss of every shot was plotted against the exposure time to obtain sensitivity. The film thickness retention was obtained from the film thickness on the unexposed area. Also, the silicon wafer having a resist pattern was placed for 30 minutes in a clean oven set at varying temperatures and allowed to stand in an aerial atmosphere, and then the heat resistance was evaluated by observing the resist pattern by means of a scanning microscope.

These results are collectively shown in Table 1. It is found from Table 1 that balance between the sensitivity and heat resistance in Application examples has markedly been improved as compared with Reference examples.

TABLE 1

Various compositions and properties of resist

| | Example No. | Weight average molecular weight | Kind of a phenol | Area ratio of GPC pattern (%) | | | B/A |
|---|---|---|---|---|---|---|---|
| | | | | A region | B region | C region | |
| Application example | 1 | 22960 | m-Cresol | 15.5 | 12.1 | 72.4 | 0.78 |
| | 2 | 10050 | m-Cresol | 15.8 | 24.5 | 59.7 | 1.55 |
| | 3 | 25740 | m-Cresol | 18.7 | 20.9 | 60.4 | 1.12 |
| | 4 | 9290 | m-/p-Cresol | 26.3 | 22.7 | 51.0 | 0.86 |
| | 5 | 21770 | m-Cresol | 14.3 | 18.6 | 67.1 | 1.30 |
| | 6 | 7600 | m-/p-Cresol | 22.7 | 21.5 | 55.8 | 0.95 |
| | 7 | 11300 | m-/p-Cresol | 23.5 | 16.4 | 60.1 | 0.70 |
| | 8 | 9200 | m-/p-Cresol | 16.6 | 25.0 | 58.4 | 1.50 |
| | 9 | 13000 | m-Cresol/p-tert-butylphenol | 23.7 | 13.5 | 62.8 | 0.60 |
| | 10 | 13200 | o-/m-/p-Cresol | 22.8 | 13.0 | 64.2 | 0.60 |

| | Reference example No. | Weight average molecular weight | Kind of a phenol | Area ratio of GPC pattern (%) | | | B/A |
|---|---|---|---|---|---|---|---|
| | | | | A region | B region | C region | |
| Comparative example | 1 | 11800 | m-Cresol | 12.1 | 39.9 | 48.0 | 3.30 |
| | 3 | 16000 | m-Cresol | 11.7 | 36.5 | 51.8 | 3.12 |
| | 4 | 20760 | m-Cresol | 8.7 | 34.3 | 57.0 | 3.94 |
| | 5 | 9600 | m-/p-Cresol | 10.1 | 41.5 | 48.4 | 4.11 |
| | 7 | 9500 | m-Cresol | 2.0 | 38.5 | 59.5 | 19.25 |
| | 8 | 26200 | m-Cresol | 2.9 | 3.9 | 93.2 | 1.34 |

| | Example No. | Novolak resin m-:p-Cresol ratio | | Amount[1] (part) | Sensitizer[2] Kind[2] | Amount[1] (part) | Sensitivity (msec) | Film thickness retention (%) | Heat resistance[3] (°C.) |
|---|---|---|---|---|---|---|---|---|---|
| | | A region | C region | | | | | | |
| Application example | 1 | — | — | 17 | ① | 5 | 260 | 97.5 | 160 |
| | 2 | — | — | 17 | ① | 5 | 200 | 95.0 | 155 |
| | 3 | — | — | 17 | ① | 5 | 290 | 98.3 | 160 |
| | 4 | m-/p- = 71/29 | m-/p- = 84/16 | 17 | ① | 5 | 277 | 99.8 | 150 |
| | 5 | — | — | 17 | ① | 5 | 270 | 95.7 | 160 |
| | 6 | m-/p- = 50/50 | m-/p- = 65/35 | 17 | ② | 5 | 150 | 99.2 | 155 |
| | 7 | m-/p- = 100/0 | m-/p- = 72/28 | 17 | ② | 5 | 250 | 99.4 | 165 |

TABLE 1-continued

Various compositions and properties of resist

| | | | | | | | | |
|---|---|---|---|---|---|---|---|---|
| 8 | m-/p- = 100/0 | m-/p- = 68/32 | 17 | ② | 5 | 160 | 99.6 | 160 |
| 9 | — | — | 17 | ③ | 5 | 280 | 99.7 | 170 |
| 10 | — | — | 17 | ④ | 5 | 290 | 99.8 | 170 |

| | Resist composition | | | | | Properties of resist | | |
|---|---|---|---|---|---|---|---|---|
| | Novolak resin | | | Sensitizer[2] | | | Film | |
| Reference example No. | m-:p-Cresol ratio A region | C region | Amount[1] (part) | Kind[2] | Amount[1] (part) | Sensitivity (msec) | thickness retention (%) | Heat resistance[3] (°C.) |
| Comparative example | 1 | — | — | 17 | ① | 5 | 150 | 92.0 | 130 |
| | 3 | — | — | 17 | ① | 5 | 250 | 94.0 | 140 |
| | 4 | — | — | 17 | ① | 5 | 440 | 95.0 | 150 |
| | 5 | m-/p- = 73/27 | m-/p- = 85/15 | 17 | ① | 5 | 240 | 94.0 | 130 |
| | 7 | — | — | 17 | ① | 5 | 380 | 95.1 | 145 |
| | 8 | — | — | 17 | ① | 5 | 650 | 97.0 | 160 |

[1]Expressed by part by weight.
[2]Kind of the sensitizer is as follows:
 1 Condensation product of naphthoquinone-(1,2)-diazide-(2)-5-sulfonyl chloride with 2,3,4-trihydroxybenzophenone.
 2 Condensation product of naphthoquinone-(1,2)-diazide-(2)-5-sulfonyl chloride with 2,3,4,4'-tetrahydroxybenzophenone.
 3 Condensation product of naphthoquinone-(1,2)-diazide-(2)-5-sulfonyl chloride with 2,3,4,3'-tetrahydroxybenzophenone.
 4 Condensation product of naphthoquinone-(1,2)-diazide-(2)-5-sulfonyl chloride with 2,3,4,2',4'-pentahydroxybenzophenone.
[3]Temperature in the clean oven at which the resist pattern begins to soften and flow.

What is claimed is:

1. A novolak resin for a positive photoresist which is produced by the addition condensation reaction of a phenol with formaldehyde and characterized in that the area ratio of the gel permeation chromatographic pattern as measured by the use of a UV(254 nm) detector, is as follows: the range wherein the molecular weight, calculated as polystyrene, is from 150 to less that 500, not including a phenol and the unreacted monomer, is from 8 to 35%, hereinafter referred to as an A region, the range wherein the molecular weight calculated as polystyrene is from 500 to less than 5000 is from 0 to 30%, hereinafter referred to as a B region, and the range wherein the molecular weight calculated as polystyrene exceeds 5000 is from 35 to 92%, herein after referred to as the C region, and wherein the ratio of the B region to the A region is 2.50 or less.

2. A novolak resin for a positive photoresist as claimed in claim 1 characterized in that the weight average molecular weight, calculated as polystyrene, of the novolak resin is from 3000 to 35000.

3. A novolak resin for a positive photoresist as claimed in claim 1 characterized in that a cresol is used as a phenol.

4. A novolak resin for a positive photoresist as claimed in claim 3 characterized in that the cresol consists of m-cresol and p-cresol.

5. A novolak resin for a positive photoresist as claimed in claim 4 characterized in that the ratio of m-cresol and p-cresol contained in the novolak resin corresponding to the A region is from 10:0 to 2:8, and wherein the ratio of m-cresol and p-cresol contained in the novolak resin corresponding to the C region is from 10:0 to 4:6.

* * * * *